United States Patent [19]

Sher et al.

[11] Patent Number: 5,801,421

[45] Date of Patent: Sep. 1, 1998

[54] STAGGERED CONTACT PLACEMENT ON CMOS CHIP

[75] Inventors: Joseph C. Sher; Manny K. F. Ma; Stephen L. Casper, all of Boise, Id.

[73] Assignee: Micron Technology, Inc., Boise, Id.

[21] Appl. No.: 850,278

[22] Filed: May 5, 1997

Related U.S. Application Data

[63] Continuation of Ser. No. 559,184, Nov. 13, 1995, abandoned.

[51] Int. Cl.⁶ .................................................. H01C 29/41
[52] U.S. Cl. .......................... 257/355; 257/357; 257/382; 257/773; 257/786
[58] Field of Search .............................. 257/355, 357, 257/369, 382, 384, 773, 774, 786, 697, 776

[56] References Cited

U.S. PATENT DOCUMENTS

| | | | |
|---|---|---|---|
| 3,868,166 | 2/1975 | Ammon | 339/176 |
| 4,242,720 | 12/1980 | Moore | 361/402 |
| 4,616,406 | 10/1986 | Brown | 29/588 |
| 4,760,554 | 7/1988 | Schreck et al. | 365/51 |
| 5,060,037 | 10/1991 | Rountree | 257/357 |
| 5,066,999 | 11/1991 | Caspser | 357/51 |
| 5,075,753 | 12/1991 | Kozono | 257/776 |
| 5,153,507 | 10/1992 | Fong et al. | 324/158 |
| 5,247,197 | 9/1993 | Ema | 257/296 |
| 5,343,366 | 8/1994 | Cipolla et al. | 361/785 |
| 5,449,939 | 9/1995 | Horiguchi et al. | 257/360 |
| 5,451,799 | 9/1995 | Kurimoto et al. | 257/355 |
| 5,508,564 | 4/1996 | Lee et al. | 257/773 |

FOREIGN PATENT DOCUMENTS

| | | | |
|---|---|---|---|
| 0107549 | 4/1989 | Japan | 257/786 |
| 01243552 | 9/1989 | Japan . | |
| 02178975 | 7/1990 | Japan . | |
| 02192162 | 7/1990 | Japan . | |

*Primary Examiner*—David B. Hardy
*Attorney, Agent, or Firm*—Schwegman, Lundberg, Woessner & kluth, P.A.

[57] ABSTRACT

A method and apparatus for increasing the number of contacts provided between two conductive layers separated by an insulator in a semiconductor integrated circuit chip is disclosed. In a first row of contacts, each contact in the row is separated by a distance, L. A second row of contacts is formed parallel to the first row. Each contact in the second row is spaced a distance of L from other contacts in the row. However, the second row is staggered from the first row, such that each contact is halfway between adjacent contacts in the first row. Each contact in the second row is located a distance of L from the two closest contacts in the first row. Successive rows are formed in a similar staggered manner.

10 Claims, 2 Drawing Sheets

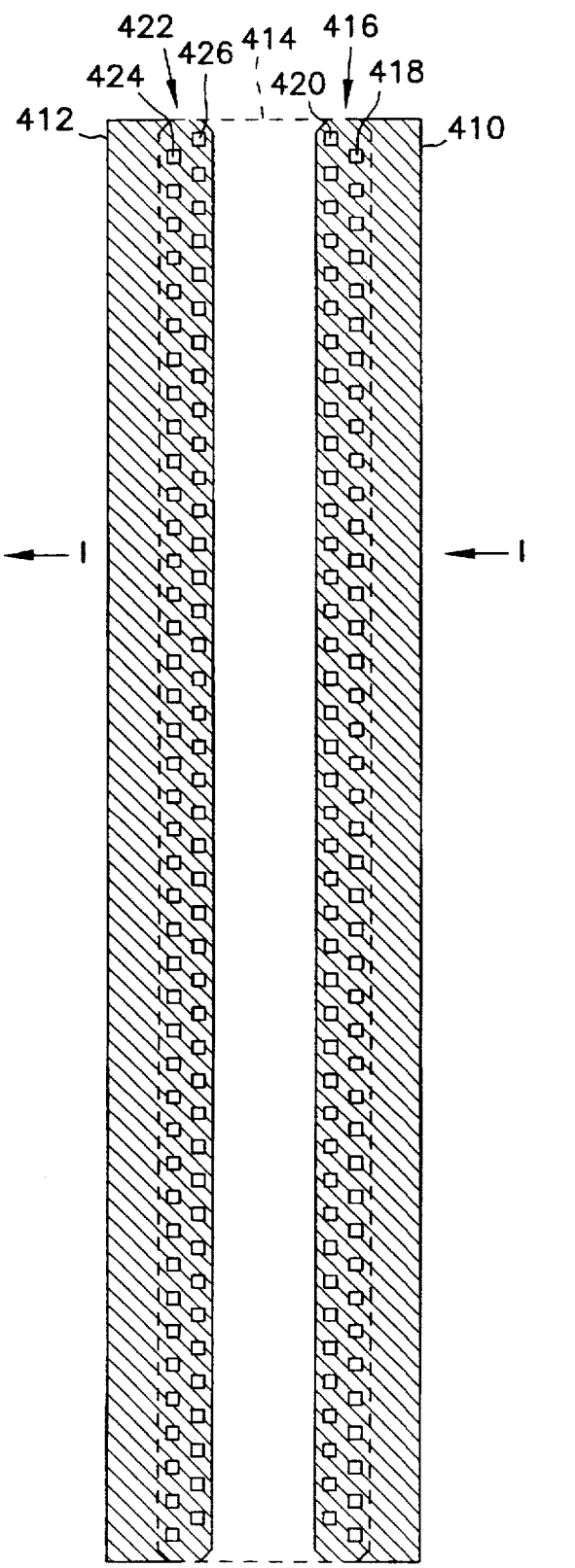
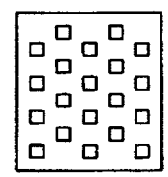
FIG. 5
FIG. 4

STAGGERED CONTACT PLACEMENT ON CMOS CHIP

This application is a continuation of U.S. patent application Ser. No. 08/559,184, filed on Nov. 13, 1995, now abandoned.

FIELD OF THE INVENTION

The present invention relates to methods and apparatus for increasing the number of contacts in a fixed space, and in particular to staggering the contact placement on a CMOS chip.

BACKGROUND OF THE INVENTION

When connecting conductive layers of a semiconductor separated by a suitable insulative layer such as silicon dioxide or BPSG, it is common to form independent conductive contacts through the insulative layer in symmetrical rows in the fixed space in accordance with design rules for spacing of structures as shown in prior art FIG. 1. Each contact in a row is spaced a distance, L, from adjacent contacts in the row, and rows are also spaced a distance, L, from adjacent rows as indicated in an expanded view of prior art contact spacing in FIG. 2. When high currents, indicated by arrows and large "T"s in FIG. 1 are being carried by the conductive layers so connected, if not enough contacts are provided, they can be harmed by the high current. Electrostatic discharge protection circuits are in need of maximizing the current that they can effectively handle. There is a need to increase the number of contacts between such conductive layers to increase the amount of current that can be conducted without violating design rules regarding spacing of physical structures.

In addition to the above problem, the contacts closest to the source of the current will, depending on the amount of sheet resistance of the conductive layer of the semiconductor, carry a disproportionately higher amount of current due to the current seeking the path of least resistance. There is a need to provide for more contacts as close to the source of the current as possible to provide a shorter path for the current, and to spread the current flow more evenly between the contacts. This must be done without violating the design rules.

One area where such contacts are used is in a dynamic random access memory (DRAM) formed with CMOS technology. One of the conductive layers is an active area of a memory transistor, such as an N+ or P+ doped area of silicon. The other conductive area is a metalized conductor layer separated from the first layer by an insulator. The contacts are used to conduct current from the active area to the conductor. Designers are looking for more way to squeeze memory cells on a chip. In the last few years, the capacity of DRAM chips has increased exponentially, from 2 Mbit chips to 64 Mbit chips with much larger chips on the drawing board. There is a great need for inventions which decrease the amount of space needed to create such memory chips. More specifically, there is a need to reduce the amount of overlap of conductive layers required to obtain a sufficient number of contacts to conduct expected maximum electrical current in order to make more room for additional memory cells or other circuitry.

SUMMARY OF THE INVENTION

The present invention teaches a method and apparatus for increasing the number of electrostatic discharge event current conducting contacts that can be provided between two conductive layers having low sheet resistance, and which are separated by an insulator in a semiconductor integrated circuit chip. The contacts are placed in a manner that complies with design rules for spacing physical structures on a chip. The contacts are staggered while maintaining the required separation between each contact. In a first row of contacts, each contact in the row is separated by a distance, L. A second row of contacts is formed parallel to the first row. Each contact in the second row is spaced a distance of L from other contacts in the row. However, the second row is staggered from the first row, such that each contact is halfway between adjacent contacts in the first row. Each contact in the second row is located a distance of L from the two closest contacts in the first row. Successive rows are formed in a similar staggered manner. This permits the spacing of rows to be less than L, increasing the total number of contacts which are placed within a given space without violating design rules for spacing of physical structures. It also provides for a greater number of contacts closer to the source of the current. This helps ensure that the current is spread more evenly between the contacts by providing a shorter path to the second row of contacts. Since current seeks the path of least resistance, having the second row of contacts closer to the first row reduces the current flow through the first row of contacts and reduces the risk that they will burn out when the conductive layers are conducting high currents.

A further advantage of the present invention is that less overlap is required for a desired number of rows of contacts. This allows the designer to reduce the overlap and thereby conserve valuable chip space for other components to increase the density of the chip, allowing the die size to be decreased. In addition to increasing the maximum amount of current that can be exchanged between the conductive layers, the invention also reduces the resistance between the two layers, which in turn reduces power consumption and heat generation during normal operation as well as during ESD events.

In one preferred embodiment, the chip on which the invention is used is a dynamic random access memory (DRAM) formed with CMOS technology. One of the conductive layers is an active area of a memory transistor, such as a N+ or P+ doped area of silicon. This active area layer is also silicided to lower its sheet resistance to approximately five ohms per square or less. Tungsten (WSi2), titanium (TiSi2) or other suitable metal, is applied to the surface of the active area to decrease the sheet resistance. The other conductive area is a metalized conductive layer separated from the first layer by an insulator. The contacts are used to conduct current from the active area to the conductor. One embodiment where high current operation is required is for input and output pads of ESD protection circuitry. The present invention provides a way to squeeze even more memory cells onto a chip by decreasing the required distance between rows of contacts.

BRIEF DESCRIPTION OF THE DRAWINGS

FIG. 4 is a planar view of a device showing contact placement between two conductive layers.

FIG. 5 is a planar view of a device showing placement of multiple rows of contacts between two conductive layers.

DESCRIPTION OF THE PREFERRED EMBODIMENT

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
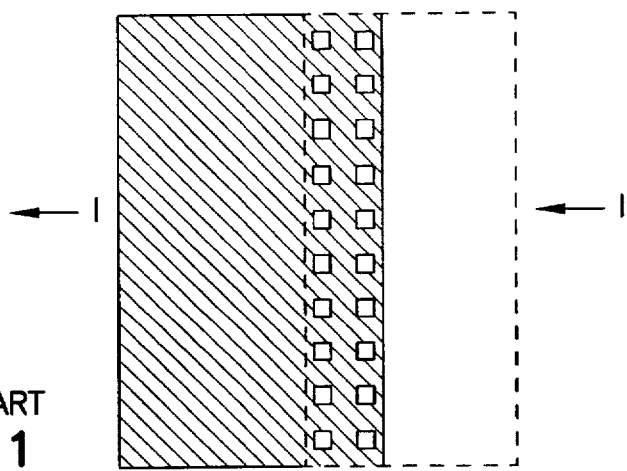
FIG. 1 is a planar view of a prior art device showing contact placement between two conductive layers.
Figure 2:
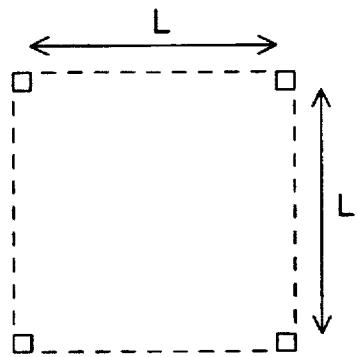
FIG. 2 is a planar view of a prior art device detailing the spacing of the contacts of FIG. 1.
Figure 3:
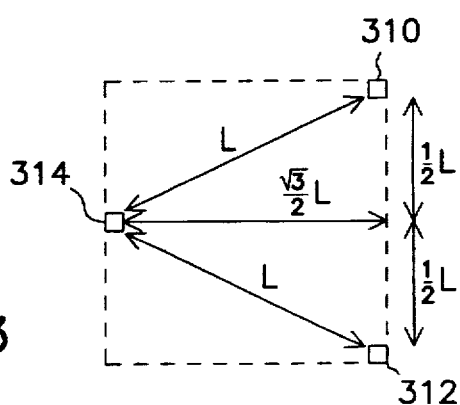
FIG. 3 is a planar view of the spacing of contacts in accordance with the present invention.

In FIG. 3, the spacing of three contacts formed in an overlapping area of two conductive areas is shown. The distance of the overlap is less than L. Where L is used herein, it is to be understood that it is being used to represent an approximate distance. In current semiconductor processes, line widths are less than one micron and are typically 0.5 microns or less. Such small dimensions lead to a very high density of circuitry and the need for many contact areas ranging from two rows of contacts with contact spacing on the order of 0.5 microns or less to 10 or more rows of contacts in the case of connections to a power bus. Manufacturing tolerances result in distances that vary from a nominal value of L.

A first contact 310 in a first row is spaced a distance of L from a second contact 312 in the first row. A third contact 314 is located in a second row of contacts. It is spaced a distance of L from both the first and second contacts in the first row. Another way of expressing this spacing is to say that contacts in the second row are staggered one-half of L from contacts in the first row. Spacing design rules require that structures be spaced a distance of L from other structures. This method of staggering the contacts complies with such rules, and results in the ability to decrease the distance between rows by about 13.4 percent. The actual spacing between rows may be reduced to $(\sqrt{3}/2) \times L$ as shown in FIG. 3. This decrease in row spacing allows more rows of contacts to be placed in a given space where conductors to be connected overlap. It also allows the area of overlap to be decreased while obtaining the same number of contacts. Where only a slight decrease in overlap is required to obtain desired circuit densities on a chip, the distance adjacent rows are staggered can be reduced to less than one-half of L. This can be useful where it is desired to more broadly distribute the current flow through one of the conductive areas.

The contacts may be any type of contact that provides an electrically conductive path between the two conductive layers. Metal through holes, vias of heavily doped polysilicon and test structure contacts, etc. may be used. There is no overhead to the design layout or process of staggering the contacts in accordance with the present invention. The contacts and conductive layers may be formed using standard processes of photomasking techniques followed by deposition, diffusion or implantation of desired substances.

A planar view of a semiconductor device utilizing the staggered contacts is shown in FIG. 4. A first active area 410 is coupled to a second active area 412 via a metalized conductive area 414 formed on top of the active areas. The conductive area 414 overlaps the active areas 410 and 412, forming a limited space over each active area where multiple rows of contacts are formed through an insulative layer covering the buried active areas. A first set of substantially parallel rows of contacts 416 are formed to couple the first active area 410 to conductive area 414. A first row, 418 has multiple contacts which are staggered or offset from the contacts of a second row 420 to allow closer placement of the rows. Where the space for such contacts is limited, staggering them can lead to a higher concentration of rows. For example, given a spacing limitation of L, if the area of overlap is a little less than 2L, only one row of contacts could be used in the prior art, while this invention provides the potential to form two rows, thereby doubling the number of contacts and hence the amount of current that can be transferred between the active area and the conductive area. This allows the designer to reduce the overlap and thereby conserve valuable chip space for other components.

A second set of substantially parallel rows of contacts 422 are formed to couple the second active area 412 to conductive area 414. A first row, 424 has multiple contacts which are staggered or offset from the contacts of a second row 426 to allow closer placement of the rows.

In one preferred embodiment, the chip on which the invention is used is a dynamic random access memory (DRAM) formed with CMOS technology. The active areas form the source or drain of a transistor and are heavily N+ or P+ doped silicon. The active area layers are also silicided or otherwise have their conductivity increased to lower their sheet resistance to approximately five ohms per square or less. When silicided, tungsten (TuSi2), titanium (TiSi2) or other suitable metal, is applied to the surface of the active areas to decrease the sheet resistance. The lower sheet resistance ensures that a substantial amount of current will flow through the second row of contacts during an ESD event.

The other conductive area is a metalized or polysilicon conductor layer separated from the first layer by an insulator of SiO2 or other common insulating material deposited or otherwise formed on the die. The contacts are used to conduct current from the active areas to the conductor. Since such areas are highly replicated in multimillion bit memory devices, the space savings is replicated with each circuit requiring multiple rows of contacts.

In CMOS circuit layouts, the height of an active area and top layer conductor, and the width of the active area may be fixed to ensure that the die size does not need to increase. Where space for overlapping conductors is limited, staggering contacts provides a higher concentration of rows of contacts. Since the total current, I, may only travel between the conductive layers through the contacts, the current through each contact is approximately I/n where n is the total number of contacts between the layers. Increasing n by use of the present invention, decreases the current through each contact, thereby reducing the chances of the contact burning out from high current. Input and output pads for ESD protection circuits are examples where a large amount of current must be carried through a very limited area. By providing for more contacts, it is less likely that an ESD event will burn out the contacts, since each contact will be required to conduct less current from the event.

Where a metal conductor is used for the top conducting layer, one can see that with multiple rows of contacts, the path of least resistance is from the buried conductive layer through the first row of conductors to the metal conductor, which has less resistance than the buried active area. A higher proportion of current is then be conducted through the first row of contacts. The present invention offloads more of this current by bringing the second row of contacts closer to the source of the current, creating a shorter path which has less resistance than the prior art devices having a row spacing of L. This helps protect the first row of contacts from burn out during high current events by reducing the amount of current that they must carry. The lower sheet resistance of the active areas further increases the amount of current carried by the second row of contacts. While five ohms per square has been referred to as a desired sheet resistance, the use of staggered contacts with active areas having a higher sheet resistance will also be of benefit.

In FIG. 5, five rows of contacts are shown in an area of overlapping conductors. Each row has contacts staggered from contacts in adjacent rows such that no two adjacent contacts are less than a distance of L from each other. The five rows may be formed in an overlap which is about 13.4% less than that required for lines spaced a distance L from each other.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An electrostatic discharge protection circuit comprising:
   a first conductive layer formed of doped silicon having a low sheet resistance and comprising the active area of a CMOS transistor;
   a second unitary metallic conductive layer having a portion overlapping the first conductive layer;
   a third insulative layer disposed between the first conductive layer and the second conductive layer;
   a first row of contacts formed between the conductive layers through the insulative layer to provide electrically conductive paths between said first conductive layer and said second conductive layer for carrying a first part of a single high current flowing in a direction generally perpendicular to the row; and
   a second row of contacts formed between the conductive layers through the insulative layer to provide electrically conductive paths between said first conductive layer and said second conductive layer for carrying a second part of the same single high current, said second row of contacts being substantially parallel to and offset from said first row of contacts so as to reduce the width of the overlapping portion required to conduct the single high current during an electrostatic discharge event,
   wherein the distance between the first and second rows of contacts is less than the distance between adjacent contacts in the first row and;
   wherein the distance between adjacent contacts in the first row is the minimum distance allowed by the design rules of the circuit, and the distance between the first row contacts and the nearest contacts in the second row of contacts is approximately the same as the distance between adjacent contacts in the first row.

2. The circuit of claim 1 wherein the first conductive layer comprises silicided n+doped silicon having a sheet resistance of approximately five ohms per square or less.

3. An electrostatic discharge protection circuit comprising:
   a first unitary conductive layer formed of doped silicon having a low sheet resistance;
   a second unitary metallic conductive layer having a portion overlapping the first conductive layer;
   a third insulative layer disposed between the first conductive layer and the second conductive layer:
   a first row of contacts formed between the conductive layers through the insulative layer to provide electrically conductive paths between said first conductive layer and said second conductive layer for carrying a first part of a single high current flowing in a direction generally perpendicular to the row;
   a second row of contacts formed between the conductive layers through the insulative layer to provide electrically conductive paths between said first conductive layer and said second conductive layer for carrying a second part of the same single high current, said second row of contacts being substantially parallel to and offset from said first row of contacts so as to reduce the width of the overlapping portion required to conduct the single high current during an electrostatic discharge event; and
   a third row of contacts formed between the conductive layers through the insulative layer to provide electrically conductive paths between said first conductive layer and said second conductive layer, said third row of contacts being substantially parallel to and offset from said second row in a direction opposite from the first row of contacts.

4. An electrostatic discharge protection circuit comprising:
   a first conductive layer comprising an active area of a CMOS transistors;
   a second unitary conductive layer at having a portion overlapping the first conductive layer and separated therefrom by an insulative layer;
   a first row of contacts electrically coupled between said first layer and said second layer for carrying a first part of a single high current flowing in a direction generally perpendicular to the row; and
   a second row of contacts electrically coupled between said first layer and said second layer for carrying a second part of the same single high current, said second row of contacts being substantially parallel to said first row, wherein the contacts in said second row are offset from the contacts in said first row so as to reduce the difference in magnitude between the first and second parts of the current,
   wherein the distance between adjacent contacts in the first row is the minimum distance allowed by the design rules of the circuit, and the distance between the first row contacts and the nearest contacts in the second row of contacts is approximately the same as the distance between adjacent contacts in the first row.

5. The circuit of claim 4 wherein the first conductive layer has a sheet resistance of approximately five ohms per square or less.

6. The circuit of claim 4 wherein the first conductive layer is silicided.

7. The circuit of claim 4 wherein the second conductive layer comprises a conductor used to conduct electrical signals from the first conductive layer to other circuitry.

8. The circuit of claim 4 wherein the first conductive layer comprises one of the source or drain of a FET transistor.

9. An electrostatic discharge protection circuit comprising:

a first unitary conductive layer;

a second unitary conductive layer at having a portion overlapping the first conductive layer and separated therefrom by an insulative layer;

a first row of contacts electrically coupled between said first layer and said second layer for carrying a first part of a single high current flowing in a direction generally perpendicular to the row;

a second row of contacts electrically coupled between said first layer and said second layer for carrying a second part of the same single high current, said second row of contacts being substantially parallel to said first row, wherein the contacts in said second row are offset from the contacts in said first row so as to reduce the difference in magnitude between the first and second parts of the current; and a third row of contacts formed between the conductive layers through the insulative layer to provide electrically conductive paths between said first conductive layer and said second conductive layer, said third row of contacts being substantially parallel to and offset from said second row in the other direction from said first row of contacts.

10. A method for forming electrostatic discharge conducting contacts between two overlapping low sheet resistance conductive layers separated by an insulator comprising the steps of:

forming a first row of contacts, each contact being spaced a distance the minimum distance allowed by the design rules of the circuit from adjacent contacts in the first row;

forming a second row of contacts offset from the first row of contacts such that the distance between the first row contacts and the nearest contacts in the second row of contacts is the same as the distance between adjacent contacts in the first row, such that the second row of contacts conducts a significant amount of a single high current during an electrostatic discharge event while reducing the overlap between the conductive layers in a direction generally perpendicular to the rows of contacts; and forming a third row of contacts offset from the second row of contacts opposite the first, the distance between the second row of contacts and the third row of contacts being less than L such that the third row of contacts conducts current during an electrostatic discharge event.

* * * * *